United States Patent
Baudendistel et al.

(10) Patent No.: US 6,842,014 B2
(45) Date of Patent: Jan. 11, 2005

(54) METHODS FOR DETERMINING INDUCTANCE AND RESISTANCE OF AN INDUCTOR

(75) Inventors: Thomas A. Baudendistel, Farmersville, OH (US); Donald T. Morelli, White Lake, MI (US); Bruce Heaston, West Milton, OH (US); Curtis Cyran, Dayton, OH (US); Jeff A. Foust, Eaton, OH (US)

(73) Assignee: Delphi Technologies, Inc., Troy, MI (US)

( * ) Notice: Subject to any disclaimer, the term of this patent is extended or adjusted under 35 U.S.C. 154(b) by 17 days.

(21) Appl. No.: 10/410,858

(22) Filed: Apr. 10, 2003

(65) Prior Publication Data

US 2004/0201386 A1 Oct. 14, 2004

(51) Int. Cl.[7] .......................... G01R 11/52; G01R 27/26
(52) U.S. Cl. .................... 324/654; 324/207.15
(58) Field of Search .................... 324/654–657, 324/713, 546, 727, 207.15, 207.16

(56) References Cited

U.S. PATENT DOCUMENTS

| | | | |
|---|---|---|---|
| 4,219,740 A | 8/1980 | Little | 307/116 |
| 4,258,315 A * | 3/1981 | Westra | 324/654 |
| 4,458,196 A | 7/1984 | Goyal et al. | 324/649 |
| 4,467,272 A | 8/1984 | Hassler et al. | 324/656 |
| 5,045,786 A | 9/1991 | Fischer | 324/207.16 |
| 5,160,893 A | 11/1992 | Lamson | 324/654 |
| 5,587,663 A | 12/1996 | Roberts et al. | 324/727 |
| 6,422,225 B1 | 7/2002 | Hamer et al. | 123/634 |
| 6,512,430 B2 | 1/2003 | Phillips, Jr. et al. | 333/185 |
| 2002/0018006 A1 | 2/2002 | Hilliard et al. | 340/941 |
| 2002/0158641 A1 | 10/2002 | Stanimirov et al. | 324/654 |

* cited by examiner

*Primary Examiner*—Vincent Q. Nguyen
(74) *Attorney, Agent, or Firm*—Michael D. Smith

(57) ABSTRACT

A resistor (having a resistance of $R_s$) is connected in series with an inductor whose inductance and/or resistance is desired to be determined. An alternating voltage (such as a sinusoidal voltage) is applied across the series-connected resistor and inductor, wherein the alternating voltage has a frequency $\omega$, a unique maximum or minimum value $V_m$, an average value and a unique crossover of the average value. The voltage $V_r$ is measured across the resistor when the alternating voltage is at its maximum or minimum value. The voltage $V_I$ is measured across the resistor when the alternating voltage is at its average value. The resistance $R_L$ of the inductor is calculated from an equation in which $R_L$ is a function of $V_m$, $V_r$, $R_s$ and $V_I$. The inductance L of the inductor is calculated from an equation in which L is a function of $V_I$, $R_I$, $R_s$, $V_r$ and $\omega$.

20 Claims, 2 Drawing Sheets

METHODS FOR DETERMINING INDUCTANCE AND RESISTANCE OF AN INDUCTOR

TECHNICAL FIELD

The present invention relates generally to determining electrical parameters, and more particularly to a method for determining the inductance of an inductor and to a method for determining the resistance of an inductor.

BACKGROUND OF THE INVENTION

Two conventional methods typically are used for determining the inductance of a inductor. One conventional method determines inductance by measuring the change in frequency due to an LR (inductor-resistor) or LCR (inductor, capacitor and resistor) oscillating circuit, as is known to those skilled in the art. However, measuring the changes in frequency of very small inductance changes is very difficult as can be appreciated by the artisan. The other conventional method determines inductance by measuring the change in amplitude of the current flowing through the inductor, as is known to those skilled in the art. However, the change in amplitude of the current is due to the change in resistance as well as the inductance which limits the accuracy of this conventional method for determining inductance, as can be appreciated by the artisan.

What is needed is an improved method for determining the inductance of an inductor and an improved method for determining the resistance of an inductor.

SUMMARY OF THE INVENTION

A first method of the invention is for determining the inductance L of an inductor and includes steps a) through f). Step a) includes connecting a resistor in series with the inductor, wherein the resistor has a resistance of $R_s$. Step b) includes applying a sinusoidal voltage across the series-connected resistor and inductor, wherein the sinusoidal voltage has a frequency $\omega$, a maximum or minimum value $V_m$ and an average value. Step c) includes measuring the voltage $V_r$ across the resistor when the sinusoidal voltage is at its maximum or minimum value. Step d) includes measuring the voltage $V_I$ across the resistor when the sinusoidal voltage is at its average value. Step e) includes calculating the resistance $R_L$ of the inductor from the following equation: $R_L = V_m V_r R_s/(V_r^2 + V_I^2) - R_s$, Step f) includes calculating the inductance L of the inductor from the following equation: $L = V_I(R_I + R_s)/(V_r \omega)$, wherein any initially calculated negative value of L has its sign changed to a positive value.

A second method of the invention is for determining the resistance $R_L$ of an inductor and includes steps a) through e) described in the previous paragraph.

A third method of the invention is for determining the inductance L of an inductor and includes steps a) through f). Step a) includes connecting a resistor in series with the inductor, wherein the resistor has a resistance of $R_s$. Step b) includes applying an alternating voltage across the series-connected resistor and inductor, wherein the alternating voltage has a frequency $\omega$, a unique maximum or minimum value $V_m$, an average value and a unique crossover of the average value. Step c) includes measuring the voltage $V_r$ across the resistor when the alternating voltage is at its maximum or minimum value. Step d) includes measuring the voltage $V_I$ across the resistor when the alternating voltage is at its average value. Step e) includes calculating the resistance $R_L$ of the inductor from an equation in which $R_L$ is a function of $V_m$, $V_r$, $R_s$ and $V_I$. Step f) includes calculating the inductance L of the inductor from an equation in which L is a function of $V_I$, $R_I$, $R_s$, $V_r$ and $\omega$.

A fourth method of the invention is for determining the resistance $R_L$ of an inductor and includes steps a) through e) described in the previous paragraph.

Several benefits and advantages are derived from one or more of the methods of the invention. The methods of the invention for determining resistance and inductance of an inductor use voltage measurements which provide for greater accuracy than conventional methods for determining inductance which measure the change in frequency of very small inductance changes and which provide for greater accuracy than conventional methods which measure the change in amplitude of the current flowing through the inductor wherein the change in amplitude of the current is due to the change in resistance as well as the inductance.

DESCRIPTION OF THE PREFERRED EMBODIMENT

Figure 1:
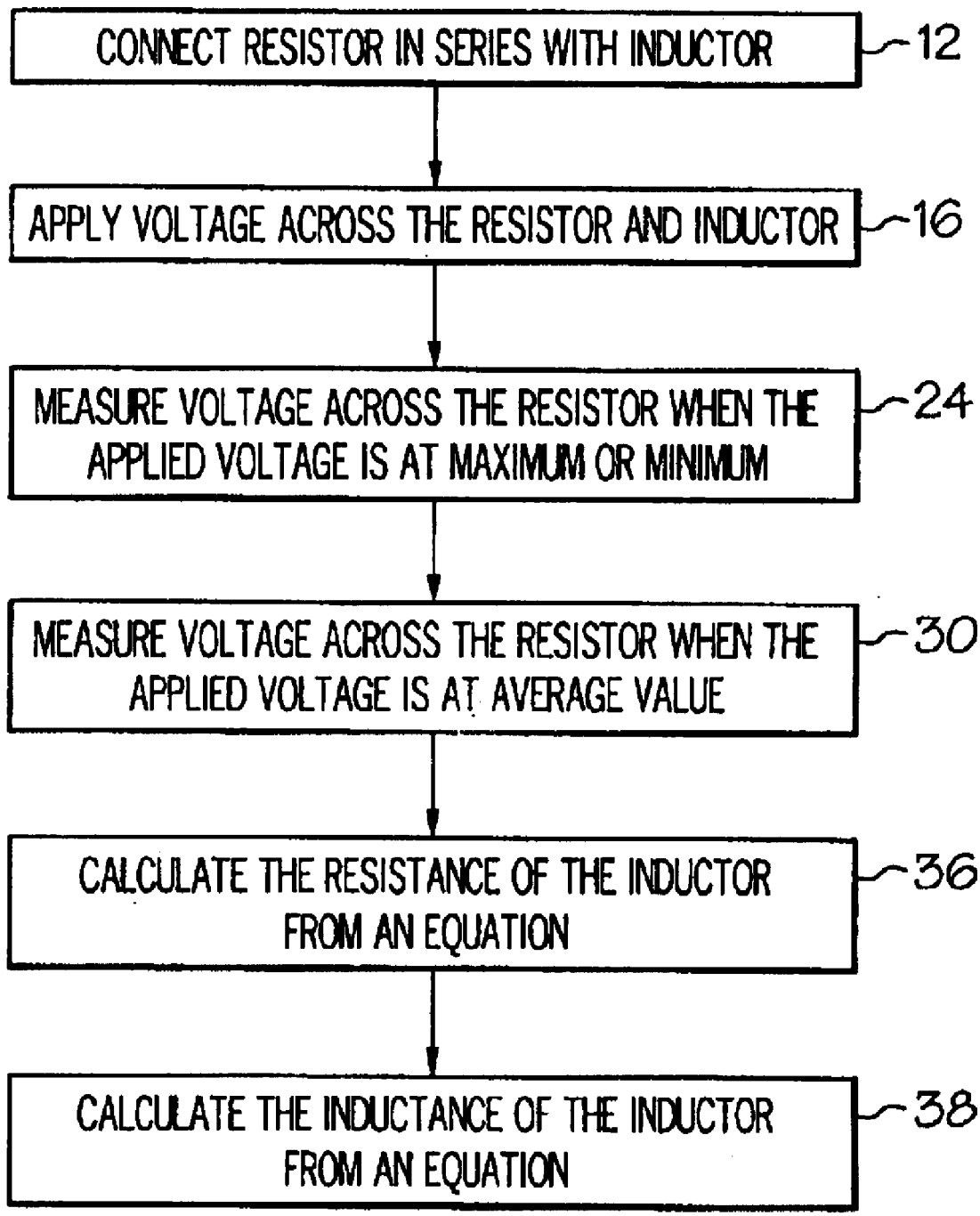
FIG. 1 is a flow chart of a first method for determining the inductance of an inductor.
Figure 2:
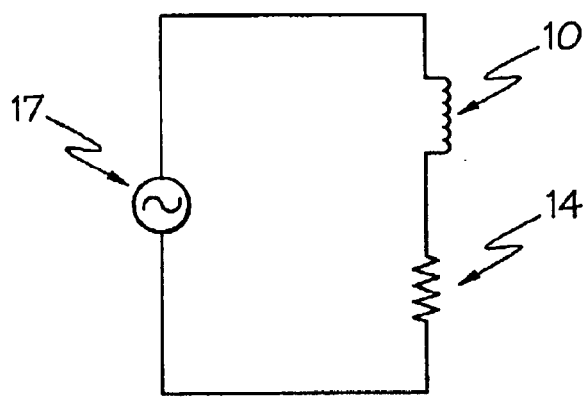
FIG. 2 is an embodiment of a circuit used for determining the inductance in accordance with the first method of FIG. 1.
Figure 3:
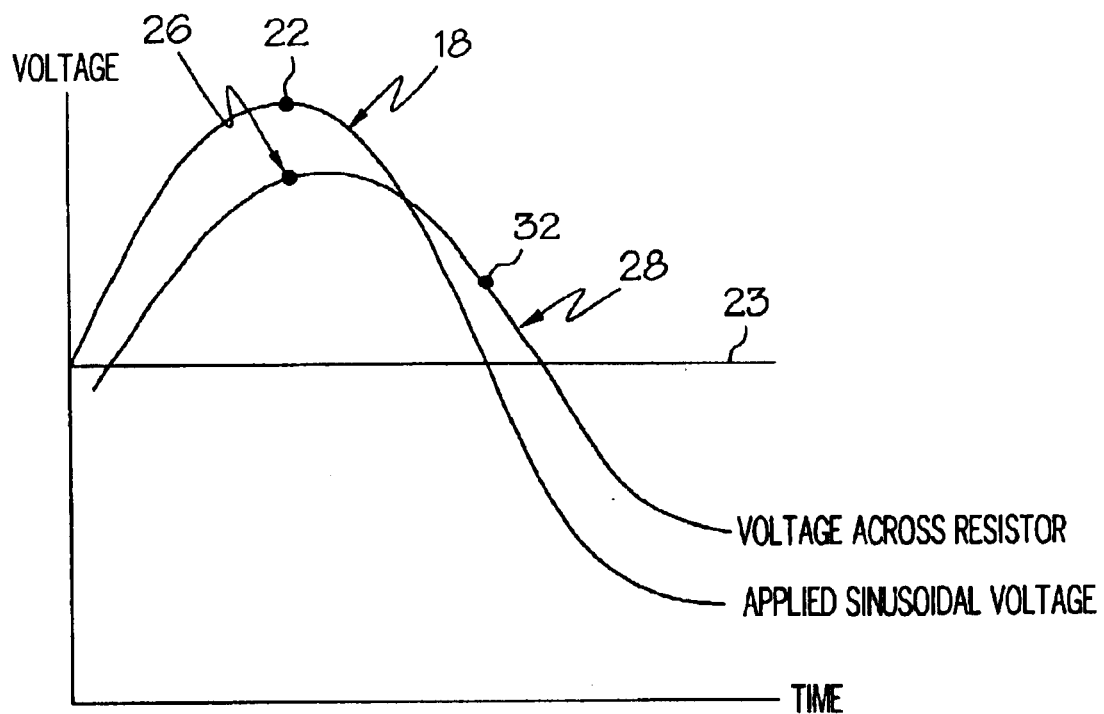
FIG. 3 is a graph of one implementation of a sinusoidal voltage applied by the voltage source of FIG. 2 and of a voltage measured across the resistor of FIG. 2 versus time.

A first method of the invention, shown in FIGS. 1–3, is for determining the inductance L of an inductor 10 (seen in FIG. 2)and includes steps a) through f). Step a) is labeled as "Connect Resistor In Series With Inductor" in block 12 of FIG. 1. Step a) includes connecting a resistor 14 (seen in FIG. 2) in series with the inductor 10, wherein the resistor 14 has a resistance of $R_s$. Step b) is labeled as "Apply Voltage Across The Resistor And Inductor" in block 16 of FIG. 1. Step b) includes applying (such as with a voltage source 17 seen in FIG. 2) a sinusoidal voltage 18 (seen in FIG. 3) across the series-connected resistor 14 and inductor 10, wherein the sinusoidal voltage 18 has a frequency $\omega$, a maximum or minimum value $V_m$ (shown by a point 22 in FIG. 3) and an average value (shown by a line 23 in FIG. 3). It is noted that a sinusoidal voltage includes a sinusoidal voltage with or without a non-zero bias voltage. Step c) is labeled as "Measure Voltage Across The Resistor When The Applied Voltage Is At A Maximum Or Minimum" in block 24 of FIG. 1. Step c) includes measuring the voltage $V_r$ (shown by a point 26 on the resistor voltage waveform 28 in FIG. 3) across the resistor 14 when the sinusoidal voltage 18 is at its maximum or minimum value. Step d) is labeled as "Measure Voltage Across The Resistor When The Applied Voltage Is At An Average Value" in; block 30 of FIG. 1. Step d) includes measuring the voltage $V_I$ (shown by a point 32 in FIG. 3) across the resistor 14 when the sinusoidal voltage is at its average value (indicated by line 23 in FIG. 3). Step e) is labeled as "Calculate The Resistance Of The Inductor From An Equation" in block 36 of FIG. 1. Step e) includes calculating the resistance $R_L$ of the inductor 10 from the following equation: $R_L = V_m V_r R_s/(V_r^2 + V_I^2) - R_s$. Step f) is labeled as "Calculate The Inductance Of The Inductor From An Equation" in block 38 of FIG. 1. Step f) includes calculating the inductance L of the inductor 10 from the following equation: $L = V_I(R_I + R_s)/(V_r \omega)$, wherein any initially calculated negative value of L has its sign changed to a positive value.

In one example of the first method, the inductor 10 is a coil. In another example, the inductor is a circuit. Other examples of inductors are left to the artisan. In one implementation of the first method, the average value of the applied sinusoidal voltage 18 is zero. In another implementation, the average value of the applied sinusoidal voltage is a non-zero value.

In one application of the first method, $V_m$ is the maximum value. In one variation, the maximum value is a positive value. In a first modification, the measurement of step d) is taken at the first occurrence of the applied sinusoidal voltage 18 equaling the average value after the taking of the measurement of step c) which was taken at the last occurrence of the applied sinusoidal voltage 18 equaling the positive maximum voltage. In the first modification, both $V_r$ and $V_l$ would have positive values, and L would be initially calculated as a positive value in step f), as can be appreciated by those skilled in the art. In a second modification, the measurement of step d) is taken at the second occurrence of the applied sinusoidal voltage equaling the average value after the taking of the measurement of step c) which was taken at the last occurrence of the applied sinusoidal voltage equaling the positive maximum voltage. In the second modification, $V_r$ would have a positive value and $V_l$ would have a negative value, and L would be initially calculated as a negative value and then have its sign changed to a positive value in step f), as can be appreciated by those skilled in the art. Other applications, variations, and modifications are left to the artisan.

In one enablement of the first method, the equations of steps e) and f) are solved by a digital computer. In other enablements, those equations are solved manually or graphically or by an analog computer, a calculator, an analog circuit or a digital circuit. Other enablements to solve the equations of steps e) and f) are left to the artisan.

The first method has been experimentally verified by the inventors.

A second method of the invention is for determining the resistance $R_L$ of an inductor and includes steps a) through e) which are depicted in blocks 10 to 18 of the flow chart of FIG. 1. Steps a) through e) of the second method are identical to steps a) through e) of the first method described in the previous four paragraphs.

A third method of the invention is for determining the inductance L of an inductor and includes steps a) through f). Steps a) and c) through f) of the third method are identical to steps a) and c) through f) of the previously described first method. Instead of describing the applied voltage as a sinusoidal voltage as in step b) of the first method, step b) of the third method is described as including applying an alternating voltage across the series-connected resistor and inductor, wherein the alternating voltage has a frequency ω, a unique maximum or minimum value $V_m$, an average value and a unique crossover of the average value. The terminology "unique maximum value" means, for purposes of describing the third and fourth methods of the invention, that the maximum value of the applied alternating voltage of step b) is not constant over a time interval as in, for example, a square wave. Likewise, the terminology "unique minimum value" means, for purposes of describing the third and fourth methods of the invention, that the minimum value of the applied alternating voltage is not constant over a time interval as in, for example, a square-wave voltage. The expression "unique crossover of the average value" means, for purposes of describing the third and fourth methods of the invention, that when the applied alternating voltage of step b) equals its average value it does not do so over a time interval as in, for example, a voltage having a value of one for one second, then a value of zero for one second, then a value of minus one for one second, then a value of zero for one second, then a value of one for one second, etc. The previously-described examples, implementations, applications, variations and modifications of the first method are equally applicable to the third method by substituting the expression "alternating voltage" of the third method for the expression "sinusoidal voltage" of the first method.

In one enablement of the third method, the alternating voltage has a triangular waveform. In a different enablement, the alternating voltage has a sinusoidal waveform. Other waveforms are left to the artisan.

In one example of the third method, the equation of step e) is the previously described equation of step e) of the first method or a mathematically equivalent equation. In the same or a different example, the equation of step f) is the previously described equation of step f) of the first method or a mathematically equivalent equation. Other examples of equations are left to the artisan.

A fourth method of the invention is for determining the resistance $R_L$ of an inductor and includes steps a) through e). Steps a) through e) of the fourth method are identical to steps a) through e) of the previously-described third method.

Several benefits and advantages are derived from one or more of the methods of the invention. The methods of the invention for determining resistance and inductance of an inductor use voltage measurements which provide for greater accuracy than conventional methods for determining inductance which measure the change in frequency of very small inductance changes and which provide for greater accuracy than conventional methods which measure the change in amplitude of the current flowing through the inductor wherein the change in amplitude of the current is due to the change in resistance as well as the inductance.

The foregoing description of several methods of the invention has been presented for purposes of illustration. It is not intended to be exhaustive or to limit the invention to the precise form or procedure disclosed, and obviously many modifications and variations are possible in light of the above teaching. It is intended that the scope of the invention be defined by the claims appended hereto.

What is claimed is:

1. A method for determining the inductance L of an inductor comprising the steps of:
   a) connecting a resistor in series with the inductor, wherein the resistor has a resistance of $R_s$;
   b) applying a sinusoidal voltage across the series-connected resistor and inductor, wherein the sinusoidal voltage has a frequency ω, a maximum or minimum value $V_m$ and an average value;
   c) measuring the voltage $V_r$ across the resistor when the sinusoidal voltage is at its maximum or minimum value;
   d) measuring the voltage $V_l$ across the resistor when the sinusoidal voltage is at its average value;
   e) calculating the resistance $R_L$ of the inductor from the following equation: $R_L = V_m V_r R_s/(V_r^2 + V_l^2) - R_s$ and
   f) calculating the inductance L of the inductor from the following equation: $L = V_l(R_l + R_s)/(V_r \omega)$, wherein any initially calculated negative value of L has its sign changed to a positive value.

2. The method of claim 1, wherein the inductor is a coil.

3. The method of claim 1, wherein the inductor is a circuit.

4. The method of claim 1, wherein the average value is zero.

5. A method for determining the inductance L of an inductor comprising the steps of:
   a) connecting a resistor in series with the inductor, wherein the resistor has a resistance of $R_s$;
   b) applying an alternating voltage across the series-connected resistor and inductor, wherein the alternating voltage has a frequency $\omega$, a unique maximum or minimum value $V_m$, an average value and a unique crossover of the average value;
   c) measuring the voltage $V_r$ across the resistor when the alternating voltage is at its maximum or minimum value;
   d) measuring the voltage $V_I$ across the resistor when the alternating voltage is at its average value;
   e) calculating the resistance $R_L$ of the inductor from an equation in which $R_L$ is a function of $V_m$, $V_r$, $R_s$ and $V_I$ and
   f) calculating the inductance L of the inductor from an equation in which L is a function of $V_I$, $R_I$, $R_s$, $V_r$ and $\omega$.

6. The method of claim 5, wherein the inductor is a coil.

7. The method of claim 5, wherein the inductor is a circuit.

8. The method of claim 5, wherein the average value is zero.

9. The method of claim 5, wherein the alternating voltage has a triangular waveform.

10. The method of claim 5, wherein the alternating voltage has a sinusoidal waveform.

11. A method for determining the resistance $R_L$ of an inductor comprising the steps of:
   a) connecting a resistor in series with the inductor, wherein the resistor has a resistance of $R_s$;
   b) applying a sinusoidal voltage across the series-connected resistor and inductor, wherein the sinusoidal voltage has a frequency $\omega$, a maximum or minimum value $V_m$ and an average value;
   c) measuring the voltage $V_r$ across the resistor when the sinusoidal voltage is at its maximum or minimum value;
   d) measuring the voltage $V_I$ across the resistor when the sinusoidal voltage is at its average value; and
   e) calculating the resistance $R_L$ of the inductor from the following equation: $R_L = V_m V_r R_s / (V_r^2 + V_I^2) - R_s$.

12. The method of claim 11, wherein the inductor is a coil.

13. The method of claim 11, wherein the inductor is a circuit.

14. The method of claim 11, wherein the average value is zero.

15. A method for determining the resistance $R_L$ of an inductor comprising the steps of:
   a) connecting a resistor in series with the inductor, wherein the resistor has a resistance of $R_s$;
   b) applying an alternating voltage across the series-connected resistor and inductor, wherein the alternating voltage has a frequency $\omega$, a unique maximum or minimum value $V_m$, an average value and a unique crossover of the average value;
   c) measuring the voltage $V_r$ across the resistor when the alternating voltage is at its maximum or minimum value;
   d) measuring the voltage $V_I$ across the resistor when the alternating voltage is at its average value; and
   e) calculating the resistance $R_L$ of the inductor from an equation in which $R_L$ is a function of $V_m$, $V_r$, $R_s$ and $V_I$.

16. The method of claim 15, wherein the inductor is a coil.

17. The method of claim 15, wherein the inductor is a circuit.

18. The method of claim 15, wherein the average value is zero.

19. The method of claim 15 wherein the alternating voltage has a triangular waveform.

20. The method of claim 15, wherein the alternating voltage has a sinusoidal waveform.

* * * * *